United States Patent
Narag, II et al.

(10) Patent No.: US 10,580,940 B2
(45) Date of Patent: Mar. 3, 2020

(54) FLEXIBLE CIRCUITS FOR MOUNTING LIGHT EMITTING SEMICONDUCTOR DEVICE

(71) Applicant: 3M INNOVATIVE PROPERTIES COMPANY, St. Paul, MN (US)

(72) Inventors: Alejandro Aldrin A. Narag, II, Singapore (SG); Ravi Palaniswamy, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/748,663

(22) PCT Filed: Aug. 30, 2016

(86) PCT No.: PCT/US2016/049408
§ 371 (c)(1),
(2) Date: Jan. 30, 2018

(87) PCT Pub. No.: WO2017/040478
PCT Pub. Date: Mar. 9, 2017

(65) Prior Publication Data
US 2018/0219136 A1 Aug. 2, 2018

Related U.S. Application Data

(60) Provisional application No. 62/213,357, filed on Sep. 2, 2015.

(51) Int. Cl.
*H01L 33/48* (2010.01)
*H01L 33/62* (2010.01)
*H05K 1/18* (2006.01)

(52) U.S. Cl.
CPC ............ *H01L 33/486* (2013.01); *H01L 33/62* (2013.01); *H05K 1/189* (2013.01); *H05K 2201/10106* (2013.01)

(58) Field of Classification Search
CPC ....... H01L 33/486; H01L 33/62; H05K 1/189; H05K 2201/10106; H05K 1/11
See application file for complete search history.

(56) References Cited

U.S. PATENT DOCUMENTS 8,933,473 B1 * 1/2015 Dubin .................. H01L 25/167
257/98
2003/0153108 A1 * 8/2003 Durocher ................ H01L 23/13
438/26

(Continued)

FOREIGN PATENT DOCUMENTS

JP 2003-209141 7/2003
KR 10-2012-0048996 5/2012

(Continued)

OTHER PUBLICATIONS

PCT International Search Report from PCT/US2016/049408 dated Oct. 27, 2016, 6 pages.

*Primary Examiner* — Steven H Loke
*Assistant Examiner* — Juanita B Rhodes
(74) *Attorney, Agent, or Firm* — Jonathan L. Tolstedt

(57) ABSTRACT

A flexible dielectric substrate (102) defines a LESD mounting region (120) including two conductive filled vias (105, 106) extending through the flexible dielectric substrate (102) and the LESD mounting region is substantially surrounded by two conductive frame portions (112, 116). The frame portions are in electrical connection with the conductive filled vias (105, 106), respectively. The conductive filled vias (105, 106) form conductive features in the mounting region (120) that are co-planar with each other.

20 Claims, 2 Drawing Sheets

(56) References Cited

U.S. PATENT DOCUMENTS

| | | | | |
|---|---|---|---|---|
| 2011/0260200 A1* | 10/2011 | Chen | ................... | C25D 5/48 |
| | | | | 257/99 |
| 2013/0213697 A1* | 8/2013 | Palaniswamy | ........ | H01L 33/486 |
| | | | | 174/254 |
| 2014/0319564 A1* | 10/2014 | Lin | ................... | H01L 24/14 |
| | | | | 257/98 |

FOREIGN PATENT DOCUMENTS

| WO | WO 2013/078180 | 5/2013 |
|---|---|---|
| WO | WO 2015/148185 | 10/2015 |

\* cited by examiner

FLEXIBLE CIRCUITS FOR MOUNTING LIGHT EMITTING SEMICONDUCTOR DEVICE

BACKGROUND

Flexible circuits and assemblies are often used as connectors in various applications of electronics equipment, such as printers, computers, monitors and the like. Such circuits offer a benefit over previously used rigid circuit boards in both flexibility and space savings.

Where LEDs are attached to flexible circuits and assemblies, an attachment technique may be utilized. Various dies attachment techniques have been used for, e.g., flip chip dies, including eutectic bonding, which is attractive due to the need for less attachment material (and correspondingly, lower cost) and performance and better reliability. Eutectic bonding generally takes place through inter-metallic bonding of gold and tin. However, despite the advantages of the bonding process, it requires a high level of co-planarity between adjacent conductors to which a common LED is being attached.

SUMMARY

The present disclosure relates to a flexible light emitting semiconductor device (LESD) assembly. A flexible dielectric substrate defines a LESD mounting region including two conductive filled vias extending through the flexible dielectric substrate and the LESD mounting region is substantially surrounded by two conductive frame portions. The frame portions are in electrical connection with the conductive filled vias, respectively. The conductive filled vias form conductive features in the mounting region that are co-planar with each other. The frame features can act as an anchor for the conductive filled vias and act as a dam feature securing the LESD or bonding material within the mounting region.

In one aspect, the present description relates to a flexible multilayer construction for mounting a light emitting semiconductor device (LESD). This construction includes a flexible dielectric substrate having opposing top and bottom major surfaces and a first LESD mounting region on the top major surface for receiving an LESD. An electrically conductive frame is disposed on the top major surface and includes electrically conductive first and second frame portions electrically are isolated from each other. The first and second portions in combination surround at least 75% of the LESD mounting region. A plurality of vias are formed in the LESD mounting region. Each via extends between the top and bottom major surfaces and is filled with an electrically conductive material to form a plurality of electrically conductive filled vias. A first conductive filled via in the plurality of conductive filled vias is electrically connected to the first frame portion, and a second conductive filled via in the plurality of conductive filled vias is electrically connected to the second frame portion.

In another aspect, the present description relates to a flexible LESD assembly. The flexible LESD assembly includes the flexible multilayer construction described herein and one or more LESDs mounted on the top major surface in the first LESD mounting region and electrically coupled to the first and second conductive filled vias.

In further aspect, the present description relates to a method of fabricating a flexible multilayer construction for mounting a light emitting semiconductor device (LESD). The method includes providing a flexible dielectric substrate having opposing top and bottom major surfaces and a first LESD mounting region on the top major surface for receiving an LESD. The method includes patterning electrically conductive first and second frame portions on the top surface to form, in combination, a frame surrounding at least 75% of the first LESD mounting region and forming a plurality of vias in the first LESD mounting region. Each via extending between the top and bottom major surfaces. Then the method includes filling each of the plurality of vias with an electrically conductive material extending from the top major surface toward the bottom major surface to form a plurality of electrically conductive filled vias and electrically connecting a first conductive filled via in the plurality of conductive filled vias to the first frame portion, and electrically connecting a second conductive filled via in the plurality of conductive filled vias to the second frame portion.

In another aspect, the present description relates to a flexible multilayer construction for mounting a light emitting semiconductor device (LESD). The construction includes a flexible dielectric substrate having opposing top and bottom major surfaces. First and second electrically conductive frame portions are disposed on the top major surface and electrically isolated from each other. The first and second frame portions in combination form a frame defining an LESD mounting region therein for receiving an LESD. The first and second frame portions each have an average thickness greater than about 15 microns and, in combination surround at least 75% of the LESD mounting region. First and second vias are formed in the LESD mounting region and extend vertically between the top and bottom major surfaces and laterally beyond the LESD mounting region. The first and second vias are filled with an electrically conductive material to form respective electrically conductive first and second filled vias. The conductive first filled via is electrically connected to the first frame portion. The conductive second filled via is electrically connected to the second frame portion, such that any electrical connection between each of the first and second frame portions and an electrical component or a conductive trace disposed on or within the flexible multilayer construction is only through the conductive first and second filled vias.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
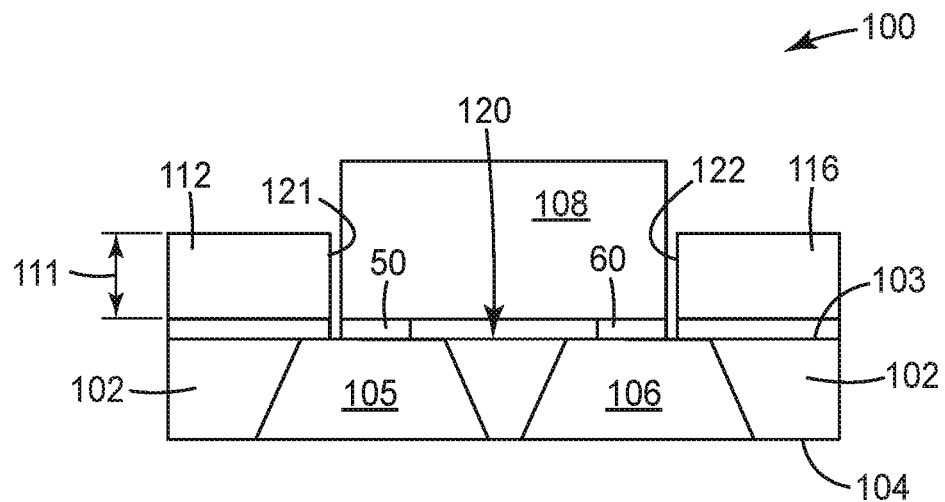
FIG. 1 is a schematic diagram cross-sectional view of a flexible LESD assembly according to the present description.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties desired by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with," "stacked on" or "in contact with" another element, component or layer, it can be directly on, directly connected to, directly coupled with, directly stacked on, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, the term "coplanar" means that the planes of the two elements lie within 0 to 2 microns of one another.

The present disclosure relates to a flexible light emitting semiconductor device (LESD) assembly. In particular the flexible dielectric substrate defines a LESD mounting region including two conductive filled vias extending through the flexible dielectric substrate and the LESD mounting region is substantially surrounded by two conductive frame portions. The frame portions are in electrical connection with the conductive filled vias, respectively. The conductive filled vias form conductive features in the mounting region that are co-planar with each other. The frame features can act as an anchor for the conductive filled vias and act as a dam feature securing the LESD or bonding material within the mounting region. While the present disclosure is not so limited, an appreciation of various aspects of the disclosure will be gained through a discussion of the examples provided below.

Figure 2:
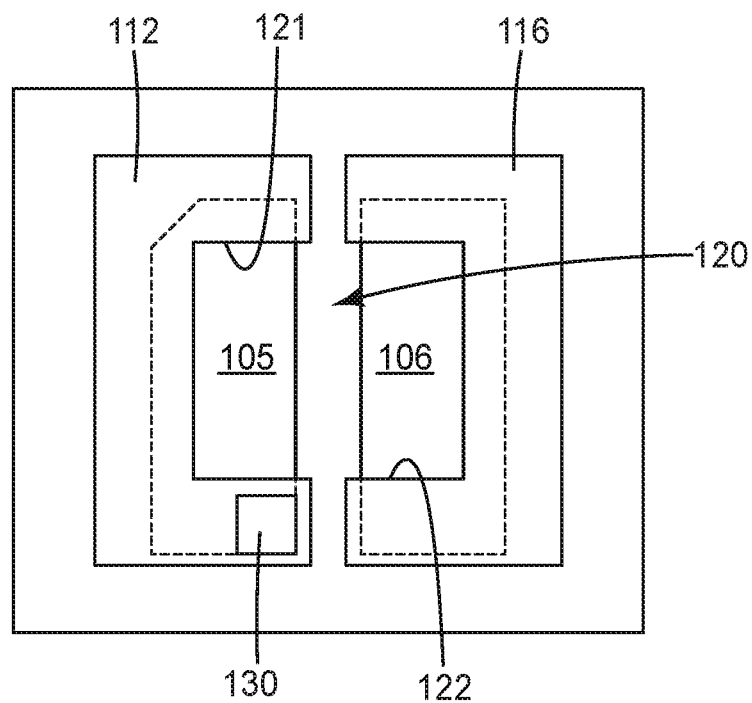
FIG. 2 is a schematic diagram top plan view of a flexible LESD assembly illustrated in FIG. 1.

FIG. 1 is a schematic diagram cross-sectional view of a flexible LESD assembly 100 according to the present description. FIG. 2 is a schematic diagram top plan view of a flexible LESD assembly illustrated in FIG. 1.

The flexible LESD assembly 100 includes a flexible dielectric substrate 102 having a top major surface 103 and an opposing bottom major surface 104. In many embodiments the flexible dielectric substrate 102 is formed of a polymer material. In some embodiments, the flexible dielectric substrate is formed of polyimide. In other embodiments, the flexible dielectric substrate is formed of any other number of appropriate flexible polymers, including, but not limited to polyethylene terephthalate (PET), liquid crystalline polymer, polycarbonate, polyether ether ketone, or thermoplastic polymer or thermosetting of flexible epoxy material.

The flexible LESD assembly 100 includes a LESD mounting region 120 on the top major surface 103 for receiving an LESD. A plurality of electrically conductive filled vias 105, 106 extend between the top major surface 103 and the bottom major surface 104 are within the LESD mounting region 120. A plurality of electrically conductive filled vias 105, 106 each have a top surface that can be co-planar with each other and a top surface of the LESD mounting region 120.

The plurality of vias can be filled with electrically conductive material including one or more of an electroplated conductive material, a solder material, or an electrically conductive paste to form the electrically conductive filled vias 105, 106. In many embodiments, the conductive material filling at least one via in the plurality of vias forms a recess at the bottom major surface of the dielectric substrate. In some embodiments, the conductive material filling at least one via in the plurality of vias extends beyond and forms a protrusion at the bottom major surface.

One or more LESDs 108 are mounted on the top major surface in the LESD mounting region 120 and electrically coupled to the first and second conductive filled vias 105, 106. The conductive frame 112, 116 has an inner wall 121, 122 substantially surrounding (as described below), but not touching, the one or more LESDs 108.

In flip-chip embodiments, the at least one LESD 108 in the one or more LESDs is electrically coupled to the first and second conductive filled vias 105, 106 via flip-chip connections 50, 60. Here, at least one LESD 108 in the one or more LESDs is a flip-chip LESD.

Figure 3:
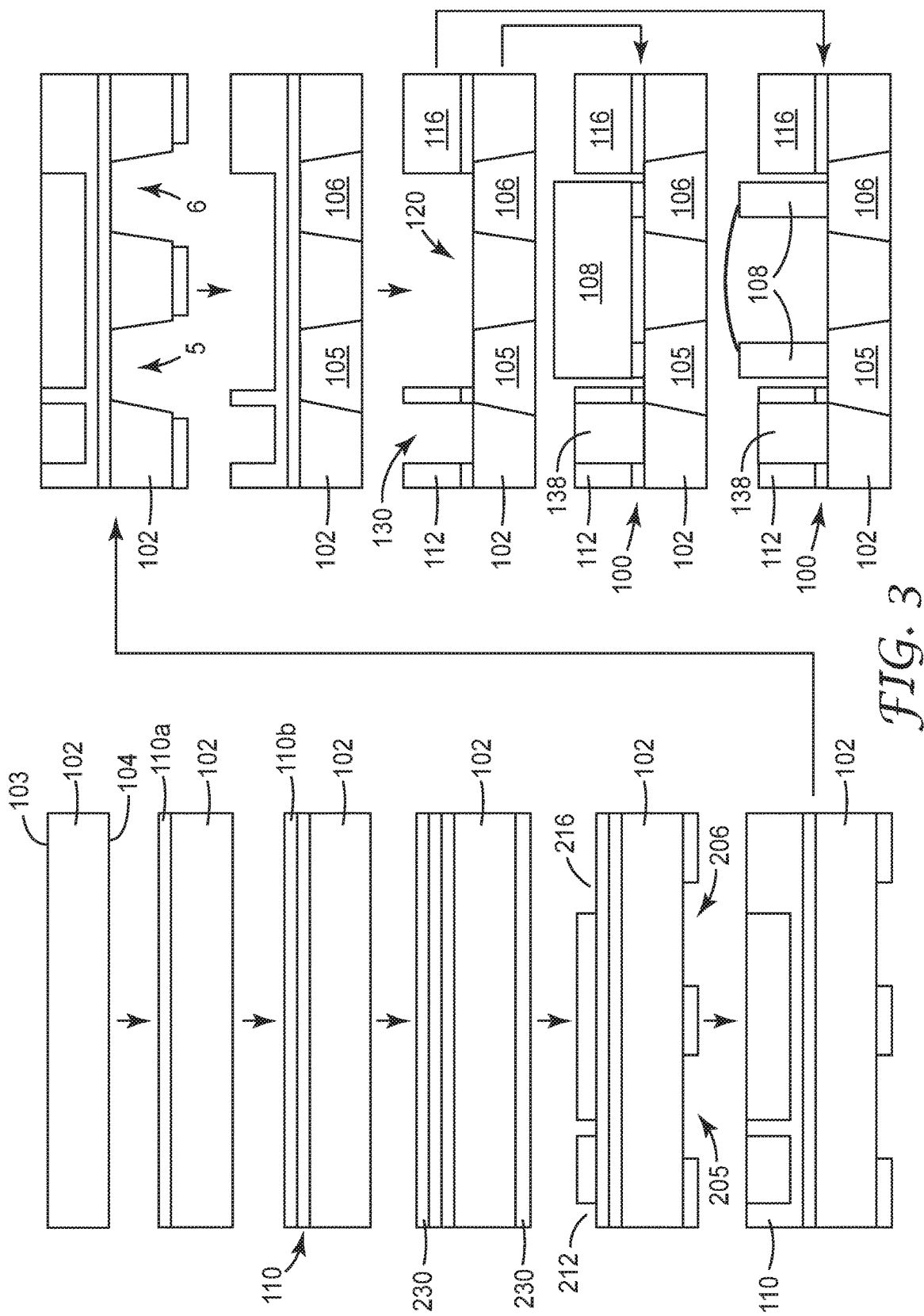
FIG. 3 is a flow diagram of a method of making a flexible LESD assembly according to the present description.

In wire-bond embodiments, the at least one LESD 108 in the one or more LESDs is electrically coupled to the first and second conductive filled vias 105, 106 via wire-bond connections (as illustrated in the last step of FIG. 3). Here, at least one LESD 108 in the one or more LESDs is a wire-bond LESD.

In many embodiments, at least one LESD 108 in the one or more LESDs electrically coupled to the first and second conductive filled vias 105, 106 via eutectic bonding. The one or more LESDs 108 include at least two LESDs adapted to emit light at different primary colors. For example, the one or more LESDs 108 include at least one of a red LESD adapted to emit red light, a green LESD adapted to emit green light, and a blue LESD adapted to emit blue light. The one or more LESDs 108 are optionally encapsulated, and can be encapsulated with a light converting material, such as a phosphor. The encapsulant can be formed of an encapsulating material such as silicone.

An electrically conductive frame 112, 116 is disposed on the top major surface 103 and includes an electrically conductive first frame portion 112 and an electrically conductive second frame portion 116 electrically isolated from each other. The first and second portions 112, 116 in combination surround at least 75% of the LESD mounting region 120. In many embodiments the first and second portions 112, 116 in combination surround at least 50%, or at least 60% or at least 70% or at least 80% or at least 90% or at least 95% of the LESD mounting region 120. In many embodiments the first and second portions 112, 116 in combination surround at least 50%, or at least 60% or at least 70% or at least 80% or at least 90%, but less than 100% or less than 99% or less than 95% of the LESD mounting region 120.

The first conductive filled via 105 is electrically connected to the first frame portion 112. The second conductive filled via 106 is electrically connected to the second frame portion 116. Preferably the first conductive filled via 105 is in contact or direct contact with the first frame portion 112 and the second conductive filled via 106 is in contact or direct contact with the second frame portion 116.

The electrically conductive first frame portion 112 and an electrically conductive second frame portion 116 extend away from the top major surface 103 of the flexible dielectric substrate 102. In many embodiments the electrically conductive first frame portion 112 and an electrically conductive second frame portion 116 are both sufficiently thick to assist in retaining the LESD 108 within the LESD mounting region 120 during a mounting of the LESD on the LESD mounting region step. In many embodiments the electrically conductive first frame portion 112 and an electrically conductive second frame portion 116 are both sufficiently thick to retain the LESD 108 within the LESD mounting region 120 during a reflow soldering process for mounting of the LESD on the LESD mounting region step.

The electrically conductive first frame portion 112 and an electrically conductive second frame portion 116 extend away from the top major surface 103 of the flexible dielectric substrate 102 a height 111 of at least 15 microns at least 20 microns or at least 30 microns or at least 40 microns or at least 50 microns or at least 60 microns or at least 80 microns. In many embodiments the electrically conductive first frame portion 112 and an electrically conductive second frame portion 116 extend away from the top major surface 103 of the flexible dielectric substrate 102 a height 111 in a range from 15 to 150 microns or a range from 25 to 125 microns.

As illustrated in FIG. 2, portions of the first conductive filled via 105 and the first frame portion 112 overlap each other in a plan view portions of the second conductive filled via 106 and the and the frame portion 116 overlap each other in a plan view. FIG. 2 illustrates the electrically conductive frame 112, 116 (solid lines) is disposed on top of the electrically conductive filled vias 105, 106 (solid line where exposed and dashed line where the frame 112, 116 overlaps it). In many embodiments, a top surface of each of the first conductive filled via 105 and second conductive filled via covers at least 30% of the LESD mounting region or covers at least 40% of the LESD mounting region or covers at least 50% of the LESD mounting region.

In illustrative embodiments, any electrical connection between the first frame portion 112 and an electrical component or a conductive trace disposed on or within the flexible multilayer construction is only through the first conductive filled via 105. Likewise, any electrical connection between the second frame portion 116 and an electrical component or a conductive trace disposed on or within the flexible multilayer construction is only through the second conductive filled via 106.

In many embodiments a second mounting region or electronic component mounting region is included in the flexible multilayer construction 100. For example, the first frame portion 112 is illustrated as defining an electronic component mounting region 130. The electronic component mounting region 130 is spaced apart from the LESD mounting region 120. In some embodiments, the electronic component mounting region 130 can extend a portion of or a thickness of the first frame portion 112 to substantially the top major surface of the flexible dielectric substrate 103.

In many embodiments, the electronic component mounting region 130 is substantially smaller than the LESD mounting region 120. In some embodiments, the electronic component mounting region 130 is adapted to receive a diode 138 such as a Zener diode. The electronic component mounting region 130 is smaller (in top plan view surface area) than the LESD mounting region 120 by at least a factor of 1.5 or by at least a factor of 2, for example.

The electrically conductive first frame portion 112 and an electrically conductive second frame portion 116 can have any useful shape that substantially surrounds the LESD mounting region 120. In many embodiments, each of the first and second frame portions 112, 116 is generally C-shaped having an open end facing the other of the first and second frame portions 112, 116, as illustrated in FIG. 2. In many embodiments, each of the first and second frame portions 112, 116 is generally rectilinear shape.

The first conductive filled via 105 and the second conductive filled via 106 can have any useful shape. In many embodiments, each of the first and second conductive filled vias 105, 106 is a polygon (in plan view).

FIG. 3 is a flow diagram of a method of making a flexible LESD assembly according to the present description. The method of fabricating a flexible multilayer construction for mounting a light emitting semiconductor device (LESD) includes, providing a flexible dielectric substrate 102 having opposing top 103 and bottom 104 major surfaces and a LESD mounting region 120 on the top major surface 103 for receiving an LESD 108.

A conductive metal layer 110 is applied to the top major surface 103. The conductive metal layer 110 can include sublayers 110a and 110b. A first sublayer 110a can be a "seed" layer that is sputtered onto the top major surface 103 and the second sublayer 110b can be flash plated on top of the first sublayer or seed layer 110a. This combination may be understood, however, as one step of applying a conductive metal layer 110 on top major surface 103 of the substrate 102.

Resist layers 230 (such as photoresist, for example) are applied to the bottom major surface 104 of the substrate 102 and the conductive metal layer 110. The resist layers 230 are patterned to form the electrically conductive first and second frame portions openings 212, 216 and first and second via openings 205, 206. An optional electronic component mounting region 130 can be patterned and included for a diode 138 as desired and as illustrated in FIG. 3.

Conductive metal 110 (such as copper, for example) is then plated or deposited in the first and second frame portions openings 212, 216 to form the first and second frame portions 112, 116 substantially surrounding the LESD mounting region 120 as described above. The first and second frame portions 112, 116 substantially surround at least 75% the LESD mounting region 120, as described above. The step of patterning electrically conductive first and second frame portions 112, 116 includes electroplating copper to a thickness of at least 15 microns or at least 20 microns, or at least 25 microns, or at least 30 microns.

Portions of the substrate 102 exposed by the first and second via openings 205, 206 are removed or etched away to form a first and second via 5, 6 that extend from the top major surface 103 to the bottom major surface 104. Each of the first and second via 5, 6 is then filled with an electrically conductive material extending from the top major surface 103 toward the bottom major surface 104 to form a plurality of electrically conductive filled vias 105, 106. The electrically conductive material can be any useful electrically conductive material such as solder material or a conductive paste, or by electroplating the via with copper, for example.

This method electrically connects the first conductive filled via 105 to the first frame portion 112, and electrically connects the second conductive filled via 106 to the second frame portion 116. In the final construction, the mounting surface of each of the first conductive filled via 105 and second conductive filled via 106 are co-planar and bonded to a LESD 108 such as a flip-chip LESD or wire-bond (lateral die) LESD.

Thus, embodiments of FLEXIBLE CIRCUITS FOR MOUNTING LIGHT EMITTING SEMICONDUCTOR DEVICE are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A flexible multilayer construction for mounting a light emitting semiconductor device (LESD), comprising:
   a flexible dielectric substrate comprising opposing top and bottom major surfaces and a LESD mounting region on the top major surface for receiving the LESD;
   an electrically conductive frame disposed on the top major surface and comprising electrically conductive first and second frame portions electrically isolated from each other, the electrically conductive first and second frame portions in combination surround at least 75% of the LESD mounting region; and
   a plurality of vias formed in the LESD mounting region, each via of the plurality of vias extending between the top and bottom major surfaces and filled with an electrically conductive material to form a plurality of electrically conductive filled vias, a first conductive filled via of the plurality of electrically conductive filled vias electrically connected to the electrically conductive first frame portion, a second conductive filled via of the plurality of electrically conductive filled vias electrically connected to the electrically conductive second frame portions;
   wherein when the LESD is being mounted on the flexible dielectric substrate in the LESD mounting region, at least one electrical connection of the LESD is in direct contact with at least one of the plurality of electrically conductive filled vias.

2. The flexible multilayer construction of claim 1, such that when the LESD is being mounted on the flexible dielectric substrate in the LESD mounting region, the electrically conductive frame is sufficiently thick to assist in retaining the LESD within the LESD mounting region during the mounting.

3. The flexible multilayer construction of claim 1, such that when the LESD is being mounted on the flexible dielectric substrate in the LESD mounting region using a reflow soldering process, the electrically conductive frame is sufficiently thick to retain the LESD within the LESD mounting region during the reflow soldering process.

4. The flexible multilayer construction of claim 1, wherein portions of the first conductive filled via of the plurality of electrically conductive filled vias and the electrically conductive first frame portion overlap each other in a plan view.

5. The flexible multilayer construction of claim 1, wherein portions of the second conductive filled via of the plurality of electrically conductive filled vias and the electrically conductive second frame portion overlap each other in a plan view.

6. The flexible multilayer construction of claim 1, wherein in a plan view, a top surface of each of the first and second conductive filled vias of the plurality of electrically conductive filled vias covers at least 30% of the LESD mounting region.

7. The flexible multilayer construction of claim 1, wherein any electrical connection between the electrically conductive first frame portion and an electrical component or a conductive trace disposed on or within the flexible multilayer construction is only through the first conductive filled via of the plurality of electrically conductive filled vias.

8. The flexible multilayer construction of claim 1, wherein any electrical connection between the electrically conductive second frame portion and an electrical component or a conductive trace disposed on or within the flexible multilayer construction is only through the second conductive filled via of the plurality of electrically conductive filled vias.

9. The flexible multilayer construction of claim 1, wherein the electrically conductive first frame portion defines an electronic component mounting region therein spaced apart from the LESD mounting region, the electronic component mounting region extending from a top surface of the first frame portion to substantially the top major surface of the flexible dielectric substrate.

10. The flexible multilayer construction of claim 9, wherein the electronic component mounting region is substantially smaller than the LESD mounting region.

11. The flexible multilayer construction of claim 1, wherein an average thickness of the electrically conductive frame is at least 20 microns.

12. The flexible multilayer construction of claim 1, wherein an average thickness of the electrically conductive frame is between 20 and 60 microns.

13. The flexible multilayer construction of claim 1, wherein in a plan view, each of the electrically conductive first and second frame portions is generally C-shaped having an open end facing the other of the first and second frame portions.

14. A flexible LESD assembly, comprising:
the flexible multilayer construction of claim 1; and
one or more LESDs mounted on the top major surface in the LESD mounting region and electrically coupled to the first and second conductive filled vias of the plurality of electrically conductive filled vias.

15. The flexible LESD assembly of claim 14, wherein the electrically conductive frame comprises an inner wall substantially surrounding, but not touching, the one or more LESDs.

16. The flexible multilayer construction of claim 1, wherein the conductive material filling at least one via of the plurality of vias forms a recess at the bottom major surface of the flexible dielectric substrate.

17. The flexible multilayer construction of claim 1, wherein the conductive material filling at least one via of the plurality of vias extends beyond and forms a protrusion at the bottom major surface.

18. A method of fabricating a flexible multilayer construction for mounting a light emitting semiconductor device (LESD), comprising:
providing a flexible dielectric substrate comprising opposing top and bottom major surfaces and a LESD mounting region on the top major surface for receiving the LESD;
patterning electrically conductive first and second frame portions on the top major surface to form, in combination, a frame surrounding at least 75% of the LESD mounting region; and
forming a plurality of vias in the LESD mounting region, each via of the plurality of vias extending between the top and bottom major surfaces;
filling each via of the plurality of vias with an electrically conductive material extending from the top major surface toward the bottom major surface to form a plurality of electrically conductive filled vias;
electrically connecting a first conductive filled via of the plurality of electrically conductive filled vias to the electrically conductive first frame portion; and
electrically connecting a second conductive filled via of the plurality of electrically conductive filled vias to the electrically conductive second frame portion;
wherein at least one of the plurality of electrically conductive filled vias is positioned such that, when the LESD is mounted on the flexible dielectric substrate in the LESD mounting region, at least one electrical connection of the LESD is in direct contact with at least a portion of the at least one of the plurality of electrically conductive filled vias.

19. The method of claim 18, wherein the step of patterning electrically conductive first and second frame portions comprises electroplating copper to a thickness of at least 15 microns.

20. A flexible multilayer construction for mounting a light emitting semiconductor device (LESD), comprising:
a flexible dielectric substrate comprising opposing top and bottom major surfaces;
first and second electrically conductive frame portions disposed on the top major surface and electrically isolated from each other, the first and second electrically conductive frame portions in combination forming a frame defining an LESD mounting region therein for receiving the LESD, the first and second electrically conductive frame portions each having an average thickness greater than about 15 microns and, in combination surround at least 75% of the LESD mounting region; and
first and second vias formed in the LESD mounting region and extending vertically between the top and bottom major surfaces and laterally beyond the LESD mounting region, the first and second vias filled with an electrically conductive material to form respective electrically conductive first and second filled vias, the electrically conductive first filled via electrically connected to the first electrically conductive frame portion, the electrically conductive second filled via electrically connected to the second electrically conductive frame portion, such that any electrical connection between each of the first and second electrically conductive frame portions and an electrical component or a conductive trace disposed on or within the flexible multilayer construction is only through the electrically conductive first and second filled vias.

\* \* \* \* \*